(12) United States Patent
Lee et al.

(10) Patent No.: US 10,818,753 B2
(45) Date of Patent: Oct. 27, 2020

(54) VTFET HAVING A V-SHAPED GROOVE AT THE TOP JUNCTION REGION

(71) Applicant: International Business Machines Corporation, Armonk, NY (US)

(72) Inventors: Choonghyun Lee, Rensselaer, NY (US); Alexander Reznicek, Troy, NY (US); Injo Ok, Loudonville, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/356,552

(22) Filed: Mar. 18, 2019

(65) Prior Publication Data

US 2020/0303503 A1  Sep. 24, 2020

(51) Int. Cl.
*H01L 29/10*  (2006.01)
*H01L 27/092*  (2006.01)
*H01L 21/8238*  (2006.01)
*H01L 29/78*  (2006.01)
*H01L 21/02*  (2006.01)
(Continued)

(52) U.S. Cl.
CPC .... *H01L 29/1037* (2013.01); *H01L 21/02532* (2013.01); *H01L 21/823807* (2013.01); *H01L 21/823814* (2013.01); *H01L 21/823828* (2013.01); *H01L 21/823885* (2013.01); *H01L 27/092* (2013.01); *H01L 29/16* (2013.01); *H01L 29/66666* (2013.01); *H01L 29/7827* (2013.01)

(58) Field of Classification Search
CPC .......... H01L 29/7827; H01L 29/66666; H01L 29/4236; H01L 29/42372; H01L 29/7397; H01L 29/66909; H01L 21/823885; H01L 21/823431; H01L 21/823487; H01L 27/092; H01L 27/0886; H01L 27/0924
See application file for complete search history.

(56) References Cited

U.S. PATENT DOCUMENTS

| | | |
|---|---|---|
| 6,225,668 B1 | 5/2001 | Shindo et al. |
| 7,696,569 B2 | 4/2010 | Fujimoto et al. |
| 9,627,531 B1 | 4/2017 | Chiang et al. |

(Continued)

FOREIGN PATENT DOCUMENTS

JP         5728444 B2        4/2015

OTHER PUBLICATIONS

Anonymous, "Self-Assembled Punch-through Stopper in VFET Transistor", IPCOM000247736D, Publication date Oct. 3, 2016, 6 pages.

(Continued)

*Primary Examiner* — Hsien Ming Lee
(74) *Attorney, Agent, or Firm* — Scully, Scott, Murphy & Presser, P.C.; Erik K. Johnson, Esq.

(57) ABSTRACT

A vertical transport field effect transistor (VTFET) is provided that includes a vertical semiconductor channel material structure (i.e., fin or pillar) having a V-shaped groove located in the topmost surface thereof. A top source/drain structure is formed in contact with the V-shaped groove present in the topmost surface of the vertical semiconductor channel material structure. No drive-in anneal is needed to form the top source/drain structure. The presence of the V-shaped groove at the top junction region provides a VTFET that has improved device performance.

18 Claims, 9 Drawing Sheets

(51) Int. Cl.
*H01L 29/16* (2006.01)
*H01L 29/66* (2006.01)

(56) References Cited

U.S. PATENT DOCUMENTS

| | | | |
|---|---|---|---|
| 9,773,891 B1 | 9/2017 | Xiao | |
| 9,960,271 B1 | 5/2018 | Xie et al. | |
| 9,972,494 B1* | 5/2018 | Bentley | H01L 29/66742 |
| 10,396,208 B2* | 8/2019 | Cheng | H01L 29/66666 |
| 2004/0206990 A1* | 10/2004 | Liao | H01L 29/0657 |
| | | | 257/288 |
| 2017/0194447 A1 | 7/2017 | Colinge et al. | |
| 2018/0342615 A1* | 11/2018 | Bergendahl | H01L 29/1037 |

OTHER PUBLICATIONS

Chuang, V. P., "Three-dimensional self-assembly of spherical block copolymer domains into V-shaped grooves", Nano letters, Aug. 31, 2006, pp. 2332-2337, vol. 6, No. 10.

* cited by examiner

VTFET HAVING A V-SHAPED GROOVE AT THE TOP JUNCTION REGION

BACKGROUND

The present application relates to a semiconductor structure and a method of forming the same. More particularly, the present application relates to a vertical transport field effect transistor (VTFET) having improved device performance and a method of forming the same.

Conventional VTFETs are devices where the source-drain current flows in a direction normal to the substrate surface. In such devices, a vertical semiconductor pillar (or fin) defines the channel with the source and drain located at opposing ends of the semiconductor pillar. VTFETs are an attractive option for technology scaling for beyond 7 nm technologies, and have potential advantages over conventional FinFETs in terms of density, performance, power consumption and integration. However, the device performance of VTFETs is limited by the external resistance at the top junction due to the difficulty in forming the top source/drain (S/D) junction.

SUMMARY

A vertical transport field effect transistor (VTFET) is provided that includes a vertical semiconductor channel material structure (i.e., fin or pillar) having a V-shaped groove located in the topmost surface thereof. A top source/drain structure is formed in contact with the V-shaped groove present in the topmost surface of the vertical semiconductor channel material structure. No drive-in anneal is needed to form the top source/drain structure (the top source/drain structure of the present application can also be referred to as a top source/drain junction structure). The presence of the V-shaped groove at the top junction region provides a VTFET that has improved device performance.

In one aspect of the present application, a semiconductor structure is provided. In one embodiment, the semiconductor structure includes at least one vertical semiconductor channel material structure having a V-shaped groove located in a topmost surface thereof. A bottom source/drain structure is located beneath the at least one vertical semiconductor channel material structure. A top source/drain structure contacts the V-shaped groove of the at least one vertical semiconductor channel material structure. A gate structure is located laterally adjacent to a sidewall of the at least one vertical semiconductor channel material structure.

In another embodiment, the semiconductor structure includes an n-type vertical transport field effect transistor (VTFET) and a laterally adjacent p-type VTFET. The n-type VTFET includes at least one vertical semiconductor channel material structure having a V-shaped groove located in a topmost surface thereof and present in an nFET device region, a bottom nFET source/drain structure located beneath the at least one vertical semiconductor channel material structure present in the nFET device region, a top nFET source/drain structure contacting the V-shaped groove of the at least one vertical semiconductor channel material structure present in the nFET device region, and an nFET gate structure located laterally adjacent to a sidewall of the at least one vertical semiconductor channel material structure present in the nFET device region.

The p-type VTFET includes at least one vertical semiconductor channel material structure having a V-shaped groove located in a topmost surface and present in a pFET device region, a bottom pFET source/drain structure located beneath the at least one vertical semiconductor channel material structure present in the pFET device region, a top pFET source/drain structure contacting the V-shaped groove of the at least one vertical semiconductor channel material structure present in the pFET device region, and a pFET gate structure located laterally adjacent to a sidewall of the at least one vertical semiconductor channel material structure present in the pFET device region.

In another aspect of the present application, a method of forming a semiconductor structure is provided. In one embodiment, the method includes forming at least one semiconductor material structure extending upward from a surface of a semiconductor substrate. Next, a bottom S/D structure is formed beneath the at least one semiconductor material structure. A gate structure is then formed that contacts a sidewall of the at least one semiconductor material structure. Next, a V-shaped groove is formed in a topmost surface of the at least one semiconductor material structure to provide at least one vertical semiconductor channel material structure having the V-shaped groove located in the topmost surface thereof. A top source/drain structure is then formed in the V-shaped groove present in the topmost surface of the at least one vertical semiconductor channel material structure.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
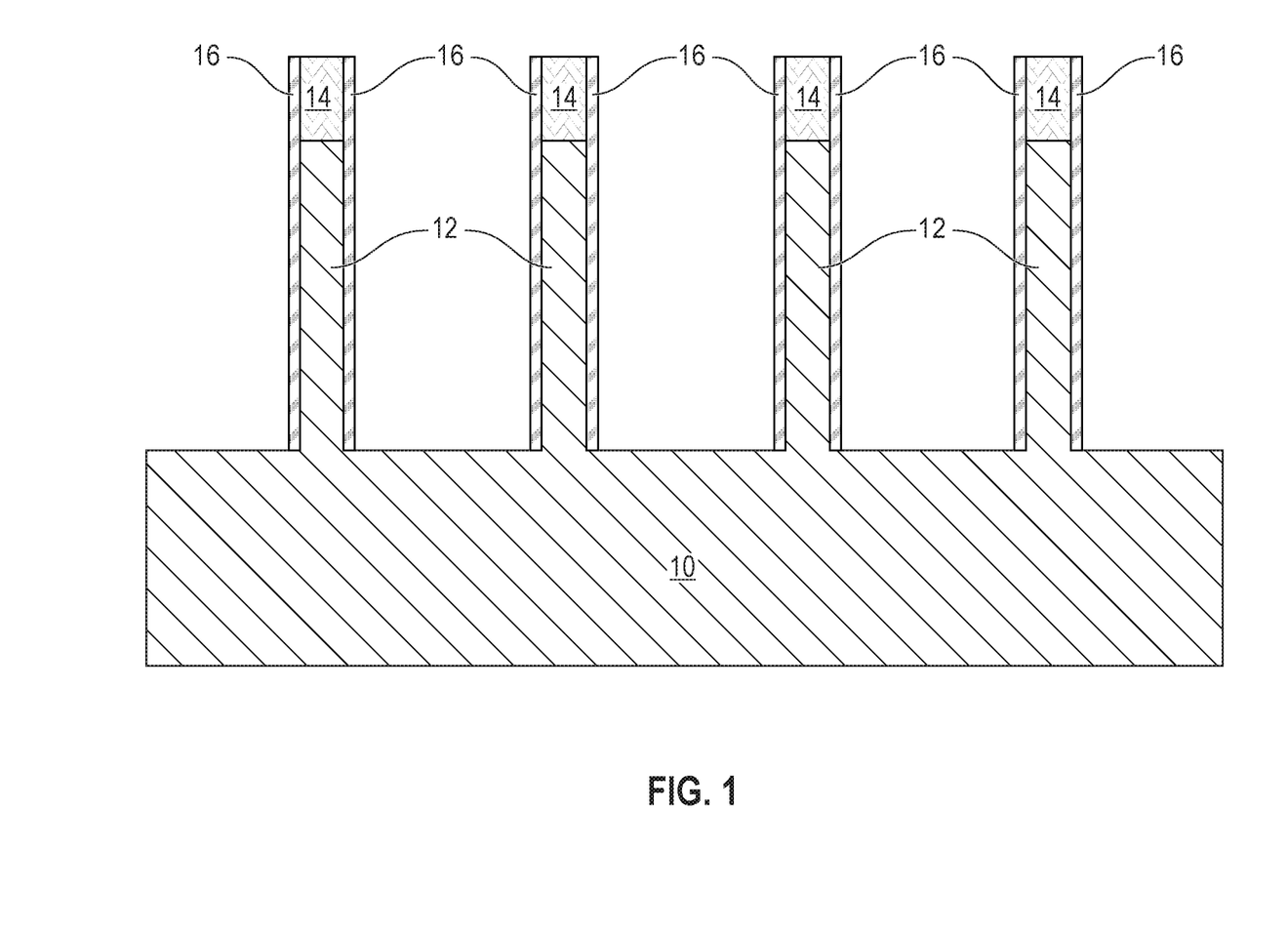
FIG. 1 is a cross sectional view of an exemplary semiconductor structure that can be employed in accordance with an embodiment of the present application and including a plurality of semiconductor material structures extending upward from a surface of a semiconductor substrate, wherein each semiconductor material structure has a dielectric hard mask cap located on a topmost thereof, and each semiconductor material structure has a sacrificial liner located along each sidewall thereof.

Referring first to FIG. 1, there is illustrated an exemplary semiconductor structure that can be employed in accordance with an embodiment of the present application. The exemplary semiconductor structure of FIG. 1 includes a plurality of semiconductor material structures 12 extending upward from a surface of a semiconductor substrate 10, wherein each semiconductor material structure 12 has a dielectric hard mask cap 14 located on a topmost thereof, and each semiconductor material structure 12 has a sacrificial liner 16 located along each sidewall thereof. Although the present application describes and illustrates the formation of a plurality of semiconductor material structures 12, the present application contemplates an embodiment in which only a single semiconductor material structure 12 is formed.

In one embodiment, each semiconductor material structure 12 is a semiconductor fin. As used herein, a "semiconductor fin" refers to a semiconductor structure including a pair of vertical sidewalls that are parallel to each other. As used herein, a surface is "vertical" if there exists a vertical plane from which the surface does not deviate by more than three times the root mean square roughness of the surface. In such an embodiment, each semiconductor fin can have a height from 15 nm to 100 nm, a length from 20 nm to 100 nm, and a width from 3 nm to 15 nm. Other semiconductor fin heights and/or widths that are lesser than, or greater than, the ranges mentioned herein can also be used in the present application. Each semiconductor fin is spaced apart from its nearest neighboring semiconductor fin by a pitch of from 20 nm to 100 nm; the pitch is measured from one point of one semiconductor fin to the exact point on a neighboring semiconductor fin. Also, each semiconductor fin is oriented parallel to each other. An opening or gap is present between each neighboring pair of semiconductor fins.

In another embodiment, each semiconductor material structure 12 is a semiconductor pillar. As used herein, a "semiconductor pillar" refers to a semiconductor structure which is similar (in terms of height and width) to a semiconductor fin except that the length of the semiconductor pillar is much less than the length of a semiconductor fin. In one embodiment, the length of the semiconductor pillar is from 3 nm to 15 nm.

The semiconductor substrate 10 can be composed of a remaining portion of a base semiconductor substrate (not shown). The semiconductor substrate 10 can be composed of one or more semiconductor materials having semiconducting properties. Examples of semiconductor materials that can provide the semiconductor substrate 10 include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

Each semiconductor material structure 12 can be composed of one of the semiconductor materials mentioned above for the semiconductor substrate 10. In one embodiment, the semiconductor material structures 12 and the semiconductor substrate 10 are composed entirely of a same semiconductor material. In such an embodiment, no material interface is present between the semiconductor material structures 12 and the semiconductor substrate 10. In one example, the semiconductor material structures 12 and the semiconductor substrate 10 are composed entirely of silicon. In another embodiment, the semiconductor material structures 12 are composed of a different semiconductor material than the semiconductor substrate 10. In such an embodiment, a material interface would exist between the bottommost surface of each semiconductor material structure 12 and the topmost surface of the semiconductor substrate 10. In one example, the semiconductor material structures 12 are composed of a silicon germanium alloy or a III-V compound semiconductor, while the semiconductor substrate 10 is composed of silicon.

Each dielectric hard mask cap 14 is composed of a dielectric hard mask material such as, for example, silicon dioxide, silicon nitride and/or silicon oxynitride. In one example, silicon nitride is employed as the dielectric hard mask material of each dielectric hard mask cap 14. As is shown, the dielectric hard mask cap 14 has sidewall surfaces that are vertically aligned to sidewall surfaces of one of the underlying semiconductor material structures 12.

A sacrificial liner 16 is present along each physically exposed sidewall of each dielectric hard mask capped semiconductor material structure (14/12). The sacrificial liner 16 is composed of a dielectric material such as, for example, silicon dioxide, silicon nitride, or silicon oxynitride. In some embodiments, the dielectric material that provides the sacrificial liner 16 is compositionally different from the dielectric hard mask material that provides each dielectric hard mask cap 14. In other embodiments, the dielectric material that provides the sacrificial liner 16 is compositionally the same as the dielectric hard mask material that provides each dielectric hard mask cap 14.

The exemplary semiconductor structure of FIG. 1 can be formed by first providing a dielectric hard mask layer (not shown) onto a surface of a base semiconductor substrate (not shown). The base semiconductor substrate is typically a bulk semiconductor substrate. By "bulk" it is meant that the base semiconductor substrate is entirely composed of at least one semiconductor material having semiconducting properties. The base semiconductor substrate can include at least one of the semiconductor materials mentioned above for semiconductor substrate 10, and the hard mask layer can include one of the dielectric hard mask materials mentioned above for the dielectric hard mask caps 14.

The dielectric hard mask layer can be formed utilizing a deposition process such as, for example, chemical vapor deposition (CVD) or plasma enhanced chemical vapor deposition (PECVD). In some embodiments, the dielectric hard mask layer can be formed by a thermal growth process such as, for example, thermal oxidation and/or thermal nitridation. In yet other embodiments, the dielectric hard mask layer can be formed utilizing a combination of, and in any order, a deposition process and a thermal growth process. The dielectric hard mask layer is a continuous layer (without any breaks or gaps) whose thickness can be from 20 nm to 100 nm. Other thicknesses that are lesser than, or greater than the aforementioned thicknesses values can also be employed as the thickness of the dielectric hard mask layer.

The dielectric hard mask layer and an upper semiconductor material portion of the base semiconductor substrate are then patterned to provide the exemplary semiconductor structure shown in FIG. 1. In one embodiment, the patterning of the dielectric hard mask layer and the upper semiconductor material portion of the base semiconductor substrate can include lithography and etching. The lithographic process includes forming a photoresist (not shown) atop a material or material stack to be patterned, exposing the photoresist to a desired pattern of radiation, and developing the exposed photoresist utilizing a conventional resist developer. The photoresist can be a positive-tone photoresist, a negative-tone photoresist or a hybrid-tone photoresist. The etching process (i.e., pattern transfer etch) includes a dry etching process (such as, for example, reactive ion etching, ion beam etching, plasma etching or laser ablation), and/or a wet chemical etching process. In some embodiments, the patterned photoresist is removed from the structure immediately after the pattern has been transferred into the dielectric hard mask layer. In other embodiments, the patterned photoresist is removed from the structure after the pattern has been transferred into both the dielectric hard mask layer and the upper semiconductor material portion of the base semiconductor substrate. In either embodiment, the patterned photoresist can be removed utilizing a conventional photoresist stripping process such as, for example, ashing.

In another embodiment, the patterning of the dielectric hard mask layer and the upper semiconductor material portion of the base semiconductor substrate can include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) can be composed of amorphous silicon or polysilicon. In another embodiment, the mandrel material layer (not shown) can be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material can comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet a further embodiment, the patterning of the dielectric hard mask layer and the upper semiconductor material portion of the base semiconductor substrate can include a direct self-assembly (DSA) process in which a copolymer that is capable of direct self-assembly is used. Other well known patterning process can also be used in forming the semiconductor material structures 12.

After the patterning process, the sacrificial liner 16 can be formed by depositing a dielectric material and then subjecting the dielectric material to an anisotropic etch such as, for example, reactive ion etching, that is selective in removing the dielectric material that provides the sacrificial liner 16 from all horizontal surfaces of the exemplary structure shown in FIG. 1. When the sacrificial liner 16 and the dielectric hard mask cap 14 are composed of a compositionally same dielectric material, then an upper portion of the dielectric hard mask cap 14 can be removed during the anisotropic etch employed in forming the sacrificial liner 16. The dielectric material that provides the sacrificial liner 16 can be deposited by, for example, chemical vapor deposition (CVD) or plasma enhanced chemical vapor deposition (PECVD). The sacrificial liner 16 can have a width, as measured from one sidewall to an opposing sidewall, from 2 nm to 10 nm; although other widths are possible and are not excluded from being used as width of the sacrificial liner 16.

Figure 2:
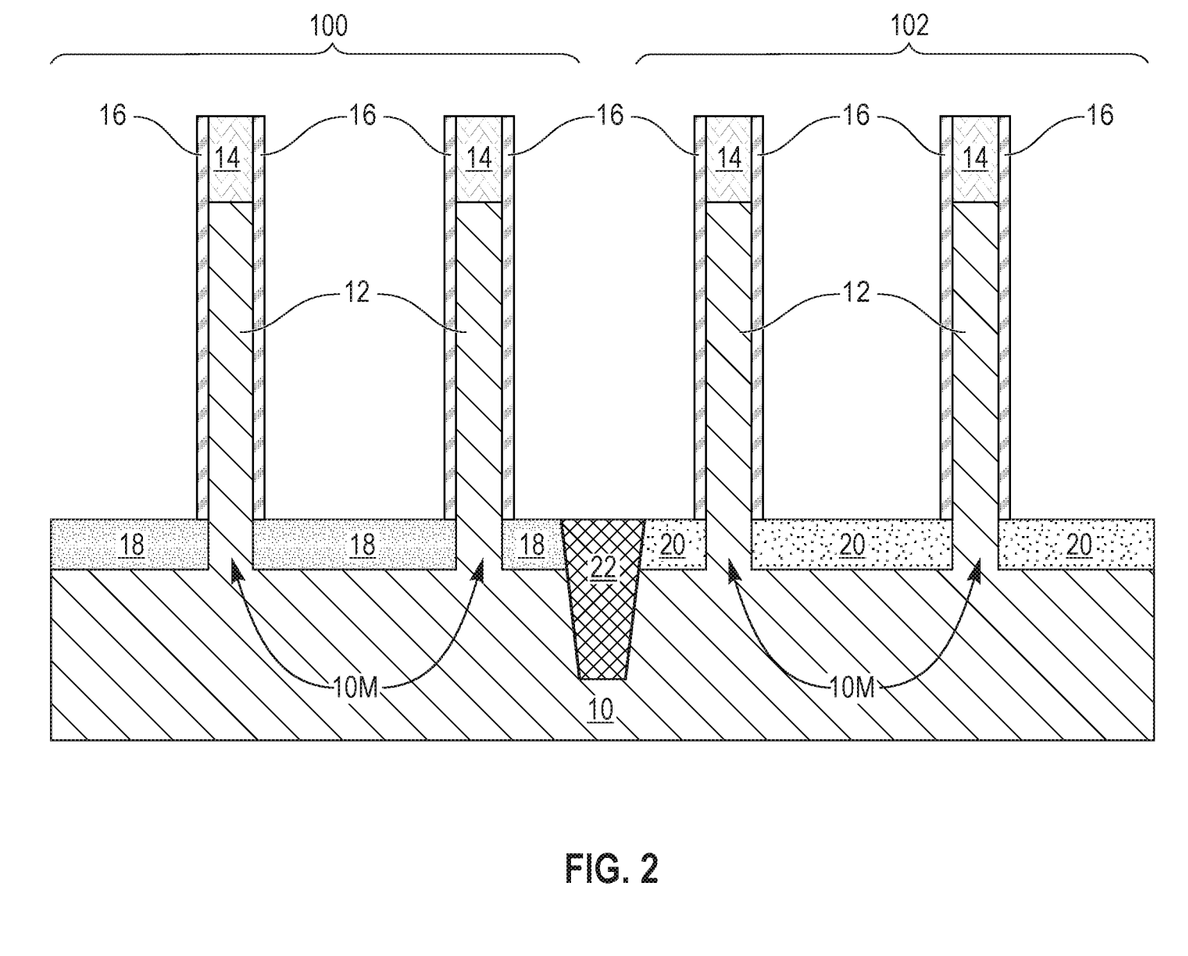
FIG. 2 is a cross sectional view of the exemplary semiconductor structure of FIG. 1 after forming a bottom nFET source/drain (S/D) region in an nFET device region, and a bottom pFET S/D region in a pFET device region, and forming an isolation structure between the different device regions.

Referring now to FIG. 2, there is illustrated the exemplary semiconductor structure of FIG. 1 after forming a bottom nFET source/drain (S/D) region 18 in an nFET device region 100, and a bottom pFET S/D region 20 in a pFET device region 102, and forming an isolation structure 22 between the different device regions (100, 102). Although the present application describes and illustrates the formation of an nFET device region 100, and a pFET device region 102, the present applicant contemplates embodiments in which only a single device region is formed.

The bottom nFET S/D region 18 and the bottom pFET S/D region 20 can be formed in any order. The bottom nFET S/D region 18 is located laterally adjacent to, and contacts, a mesa portion 10M of the semiconductor substrate 10, and the bottom pFET S/D region 20 is also laterally adjacent to, and contacts, a mesa portion 10M of the semiconductor substrate 10.

In one embodiment, the bottom nFET S/D region 18 and the bottom pFET S/D region 20 can be formed utilizing an angled ion implantation process in which an n-type dopant (to be defined in greater detail herein below) or a p-type dopant (to be defined in greater detail herein below) is introduced into the semiconductor substrate 10. In such a process, a block mask can be used to protect one device region, while processing the other device region to include the bottom S/D region. The block mask is removed, and then another block mask is formed over the processed device region, while the non-processed device region is processed to include the other bottom S/D region.

In another embodiment, the bottom nFET S/D region 18 and the bottom pFET S/D region 20 can be formed by forming a trench at the footprint of each semiconductor material structure 12, and then epitaxially filling the trenches in the nFET device region 100 with an n-type doped semiconductor material, and epitaxially filling the trenches in the pFET device region 102 with a p-type doped semiconductor material. In such a process, a block mask can be used to protect one device region, while processing the other device region to include the bottom S/D region. The block mask is removed, and then another block mask is formed over the processed device region, while the non-processed device region is processed to include the other bottom S/D region.

In the present application, the terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth can be performed at a temperature of from 300° C. to 800° C. The epitaxial growth can be performed utilizing any well known precursor gas or gas mixture. Carrier gases like hydrogen, nitrogen, helium and argon can be used. A dopant (n-type or p-type, as defined below) is typically added to the precursor gas or gas mixture.

The bottom nFET S/D region 18 includes an n-type doped semiconductor material. The semiconductor material that can be used in providing the bottom nFET S/D region 18 includes, but is not limited to, silicon (Si), germanium (Ge), silicon germanium alloys (SiGe), silicon carbide (SiC), silicon germanium carbide (SiGeC), III-V compound semiconductors or II-VI compound semiconductors. In some embodiments, the semiconductor material that provides the bottom nFET S/D region 18 is composed of silicon. The semiconductor material that provides the bottom nFET S/D region can be compositionally the same as, or compositionally different from, each of the semiconductor material structures 12 and/or the semiconductor substrate 10.

The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The concentration of n-type dopant within the semiconductor material that provides the bottom nFET S/D region 18 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived.

The bottom pFET S/D region 20 includes one of the semiconductor materials mentioned above for the bottom nFET S/D region 18 and a p-type dopant. The semiconductor material that provides the bottom pFET S/D region 20 can be compositionally the same as, or compositionally different from, the semiconductor material of that provides the bottom nFET S/D region 18. Also, the semiconductor material that provides the bottom pFET S/D region 20 can be compositionally the same as, or compositionally different from each of the semiconductor material structures 12 and/or the semiconductor substrate 10.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of p-type dopant within the semiconductor material that provides the bottom pFET S/D region 20 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived.

In some embodiments, isolation structure 22 can be formed between the different device regions (100/102). The isolation structure 22 can be formed by forming a trench opening in an area in which sidewalls of the bottom nFET S/D region 18 and bottom pFET S/D region 20 are in contact with each other, and then filling the trench opening with a trench dielectric material such as, for example, silicon dioxide. A recess etch may follow the trench filling step. Although the present application describes forming the isolation structure 22 after forming the bottom nFET S/D region 18 and the bottom pFET S/D region 20, the isolation structure 22 can be formed prior to forming the bottom nFET S/D region 18 and the bottom pFET S/D region 20.

Figure 3:
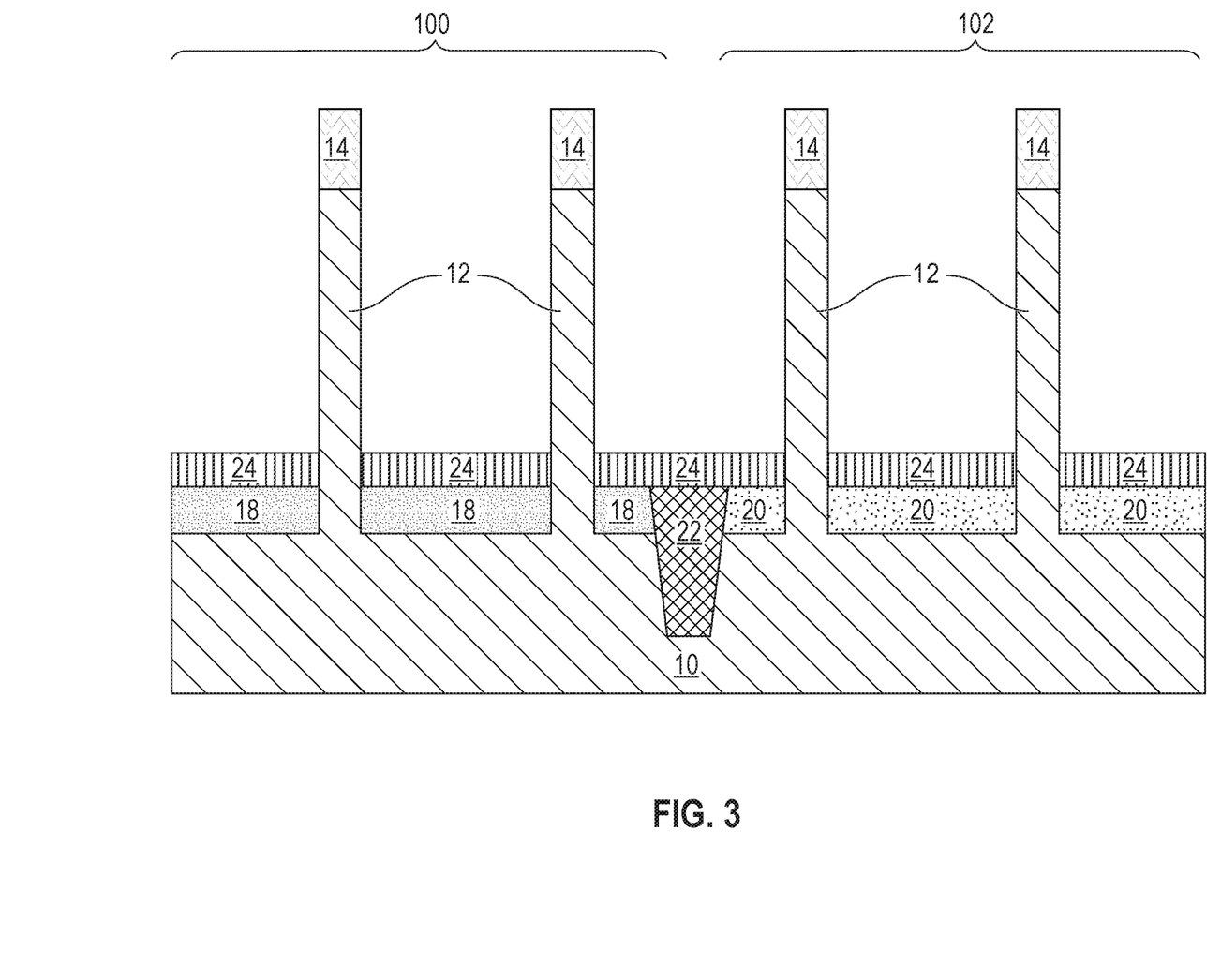
FIG. 3 is a cross sectional view of the exemplary semiconductor structure of FIG. 2 after removing the sacrificial liner from each semiconductor material structure, and forming a bottom spacer layer.

Referring now to FIG. 3, there is illustrated the exemplary semiconductor structure of FIG. 2 after removing the sacrificial liner 16 from each semiconductor material structure 12, and forming a bottom spacer layer 24. The sacrificial liner 16 can be removed from each semiconductor material structure 12 utilizing an etching process that is selective in removing the sacrificial liner 16 from the exemplary structure shown in FIG. 2. A portion of each dielectric hard mask cap 14 may, or may not, be removed during the sacrificial liner 16 removal.

The bottom spacer layer 24 has a sidewall that directly contacts a lower portion of a sidewall of each of the semiconductor material structures 12. The bottom spacer layer 24 can be composed of any dielectric spacer material including, for example, silicon dioxide, silicon nitride, or silicon oxynitride. The dielectric spacer material that provides the bottom spacer layer 24 can be composed of a low k dielectric material (i.e., a dielectric material having a dielectric constant that is less than the dielectric constant of 4.0, all dielectric constants mentioned herein as measured in a vacuum). An example of a low k dielectric material that can be used as the bottom spacer layer 24 includes a dielectric material including atoms of silicon, boron, carbon and nitrogen.

The bottom spacer layer 24 can be formed utilizing a deposition process such as, for example, chemical vapor deposition or plasma enhanced chemical vapor deposition. In some instances, an etch back process may follow the deposition of the dielectric spacer material that provides the bottom spacer layer 24. The bottom spacer layer 24 can have a thickness from 5 nm to 15 nm. Other thicknesses that are lesser than, or greater than, the aforementioned thickness range can also be employed in the present application as the thickness of the bottom spacer layer 24 as long as the height of the bottom spacer layer 24 is not greater than the height of the semiconductor material structures 12.

Figure 4:
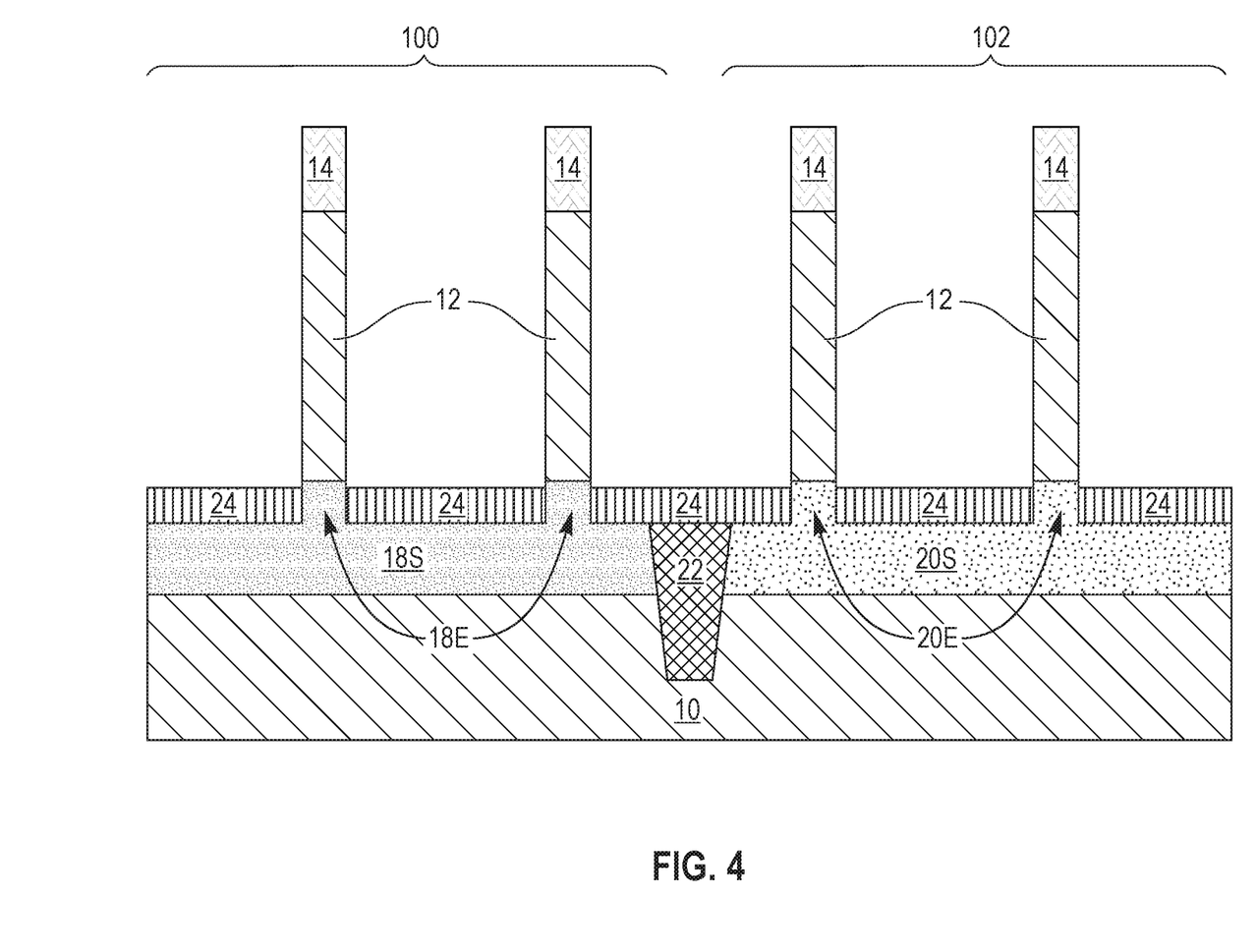
FIG. 4 is a cross sectional view of the exemplary semiconductor structure of FIG. 3 after performing a drive-in anneal to provide a bottom nFET S/D structure that includes a bottom nFET S/D extension region, and a bottom pFET S/D structure that includes a bottom pFET S/D extension region.

Referring now to FIG. 4, there is illustrated the exemplary semiconductor structure of FIG. 3 after performing a drive-in anneal to provide a bottom nFET S/D structure 18S that includes a bottom nFET S/D extension region 18E, and a bottom pFET S/D structure 20S that includes a bottom pFET S/D extension region 20E. The drive-in anneal causes diffusion of n-type dopants from the bottom nFET S/D regions 18 into the mesa portion 10M of the semiconductor substrate 10 that is present in the nFET device region 100 forming the bottom nFET S/D extension region 18E, while causing diffusion of p-type dopants from the bottom pFET S/D regions 20 into the mesa portion 10M of the semiconductor substrate 10 that is present in the pFET device region forming the bottom pFET S/D extension region 20E. Diffusion of dopants (n-type and p-type) into the semiconductor substrate 10 that is located beneath the bottom S/D regions (18, 20) also occurs during this drive-in anneal.

The drive-in anneal can be performed at a temperature from 850° C. or greater. In one example, the drive-in anneal is performed at a temperature from 950° C. to 1050° C. The drive-in anneal can include laser annealing, flash annealing, rapid thermal annealing (RTA) or any suitable combination thereof.

As is shown, the bottom nFET S/D extension region 18E directly contains a bottommost surface of each semiconductor material structure 12 that is present in the nFET device region 100, and the bottom pFET S/D extension region 20E directly contains a bottommost surface of each semiconductor material structure 12 that is present in the pFET device region 102.

Figure 5:
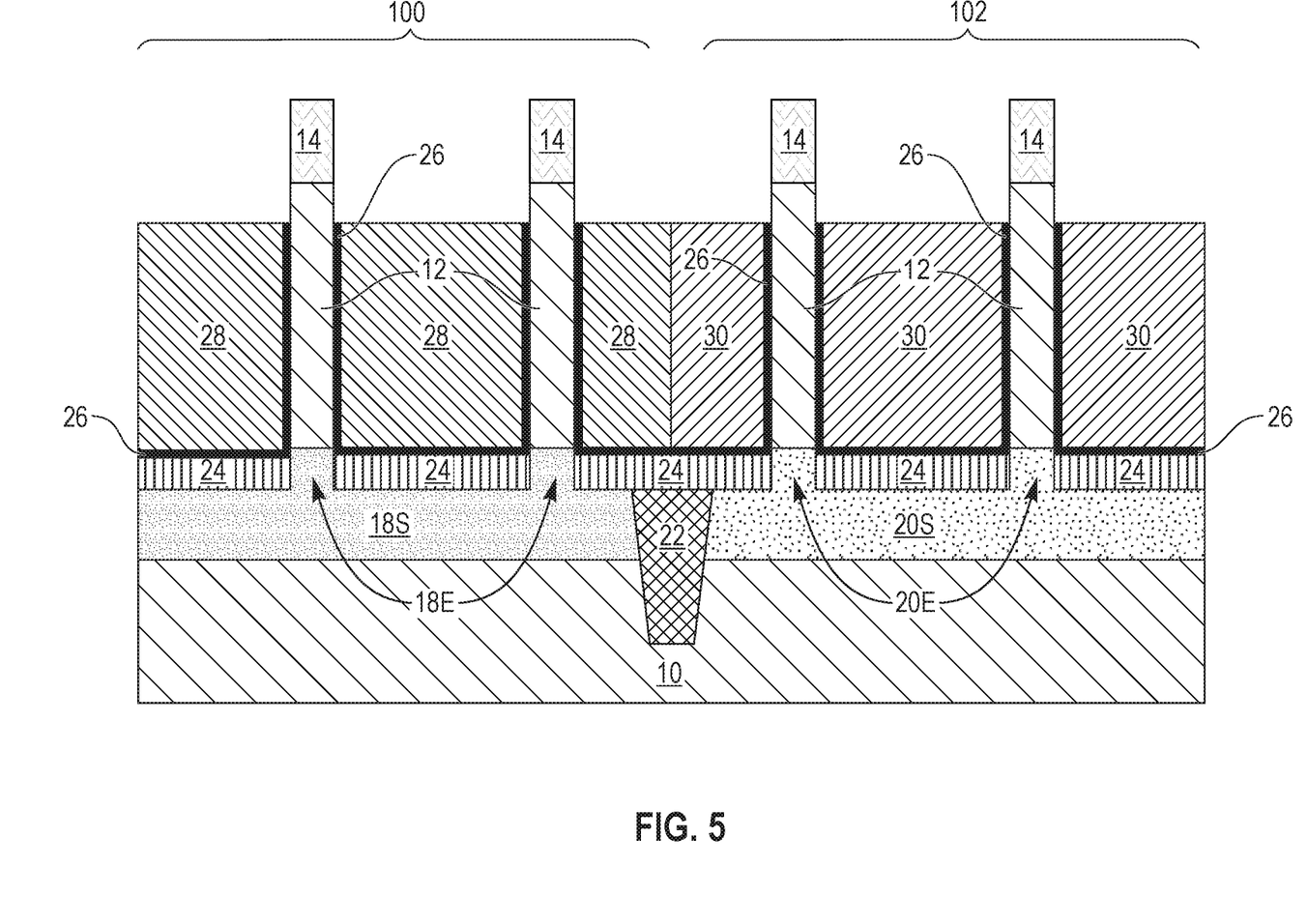
FIG. 5 is a cross sectional view of the exemplary semiconductor structure of FIG. 4 after forming an nFET gate structure contacting a sidewall of each semiconductor material structure in the nFET device region, and a pFET gate structure contacting a sidewall of each semiconductor material structure in the pFET device region.

Referring now to FIG. 5, there is illustrated the exemplary semiconductor structure of FIG. 4 after forming an nFET gate structure contacting a sidewall of each semiconductor material structure 12 in the nFET device region 100, and a pFET gate structure contacting a sidewall of each semiconductor material structure 12 in the pFET device region 102. The nFET gate structure includes a high-k gate dielectric material 26, and an n-type work function metal 28 (as a gate electrode), while the pFET gate structure includes high-k gate dielectric material 26, and a p-type work function metal 30 (as a gate electrode).

The term "high-k gate dielectric material" denotes a gate dielectric material having a dielectric constant greater than 4.0; all dielectric constants mentioned herein are measured in a vacuum. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The high-k gate dielectric material 26 can be formed by any deposition process including, for example, chemical vapor deposition (CVD), plasma enhanced chemical vapor deposition (PECVD), physical vapor deposition (PVD), sputtering, or atomic layer deposition (ALD). In one embodiment of the present application, the high-k gate dielectric material 26 can have a thickness in a range from 1 nm to 10 nm. Other thicknesses that are lesser than, or greater than, the aforementioned thickness range can also be employed for high-k gate dielectric material 26. The high-k gate dielectric material 26 typically has a conformal thickness. The term "conformal" denotes that a material layer has a vertical thickness along horizontal surfaces that is substantially the same (i.e., within ±5%) as the lateral thickness along vertical surfaces.

In some embodiments (not shown), an interfacial dielectric material can be formed prior to forming the high-k gate dielectric material 26. When present, the interfacial dielectric material is composed of silicon dioxide. The interfacial dielectric material can be formed utilizing a thermal oxidation (i.e., growth) process. The interfacial dielectric material can have a thickness from 0.5 nm to 2.0 nm.

The n-type work function metal 28 effectuates an n-type threshold voltage shift. "N-type threshold voltage shift" as used herein means a shift in the Fermi energy of an n-type semiconductor device towards a conduction band of silicon in a silicon-containing material of the n-type semiconductor device. The "conduction band" is the lowest lying electron energy band of the doped material that is not completely filled with electrons. In one embodiment, the work function of the n-type work function metal 28 ranges from 4.1 eV to 4.3 eV.

In one embodiment, the n-type work function metal 28 is composed of at least one of titanium aluminum, titanium aluminum carbide, tantalum nitride, titanium nitride, hafnium nitride, hafnium silicon, or combinations and thereof. The n-type work function metal 28 can be a single material layer or a multi-material layer.

The p-type work function metal 30 effectuates a p-type threshold voltage shift. In one embodiment, the work function of the p-type work function metal 30 ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing material of the p-type semiconductor device. A "valence band" is the highest range of electron energies where electrons are normally present at absolute zero.

In one embodiment, the p-type work function metal 30 can be composed of titanium and its nitride or carbide. In one specific embodiment, the p-type work function metal 30 is composed of titanium nitride. The p-type work function metal 30 can also be composed of titanium aluminum nitride, tantalum nitride, ruthenium, platinum, molybdenum, cobalt, and alloys and combinations or thereof. The p-type work function metal 30 can be a single material layer or a multi-material layer.

The work function metals (28, 30) can be formed utilizing a deposition process such as, for example, chemical vapor deposition (CVD), plasma enhanced chemical vapor deposition (PECVD), physical vapor deposition (PVD), sputtering, or atomic layer deposition (ALD). In one embodiment, the work function metals (28, 30) can have a thickness in a range from 1 nm to 10 nm. Other thicknesses that are lesser than, or greater than, the aforementioned thickness range can also be employed for each of work function metals (28, 30).

The exemplary structure of FIG. 5 can be formed utilizing techniques well-known to those skilled in the art. In one embodiment, the gate structures can be formed by first forming a continuous layer of the high-k gate dielectric material 26 on the entire structure shown in FIG. 4. After forming the continuous layer of the high-k gate dielectric material 26, the work function metals (28, 30) can be formed. The order of forming the work function metals (28, 30) can vary. In one embodiment, the n-type work function metal 28 is formed prior to the p-type work functional metal 30. In another embodiment, the p-type work function metal 30 is formed prior to the n-type work function metal layer 28. In either embodiment, a continuous layer of one of the work function metals is formed in both device regions 100, 102. A block mask is then formed over the work function metal that is present in the appropriate device region, and then an etch is used to remove the work function metal from the inappropriate device region. Another work function metal of the appropriate type is then formed in the device area not including the previously formed work function metal. After forming the n-type work function metal 28, and the p-type work function metal 30, the work function metals (28, 30) can be recessed to physically expose a portion of the continuous layer of the high-k gate dielectric material 26. An etch is then used to remove the physically exposed portion of the continuous layer of the high-k gate dielectric material 26 such that an upper portion of each semiconductor material structure 12 is physically exposed as is shown in FIG. 5.

Figure 6:
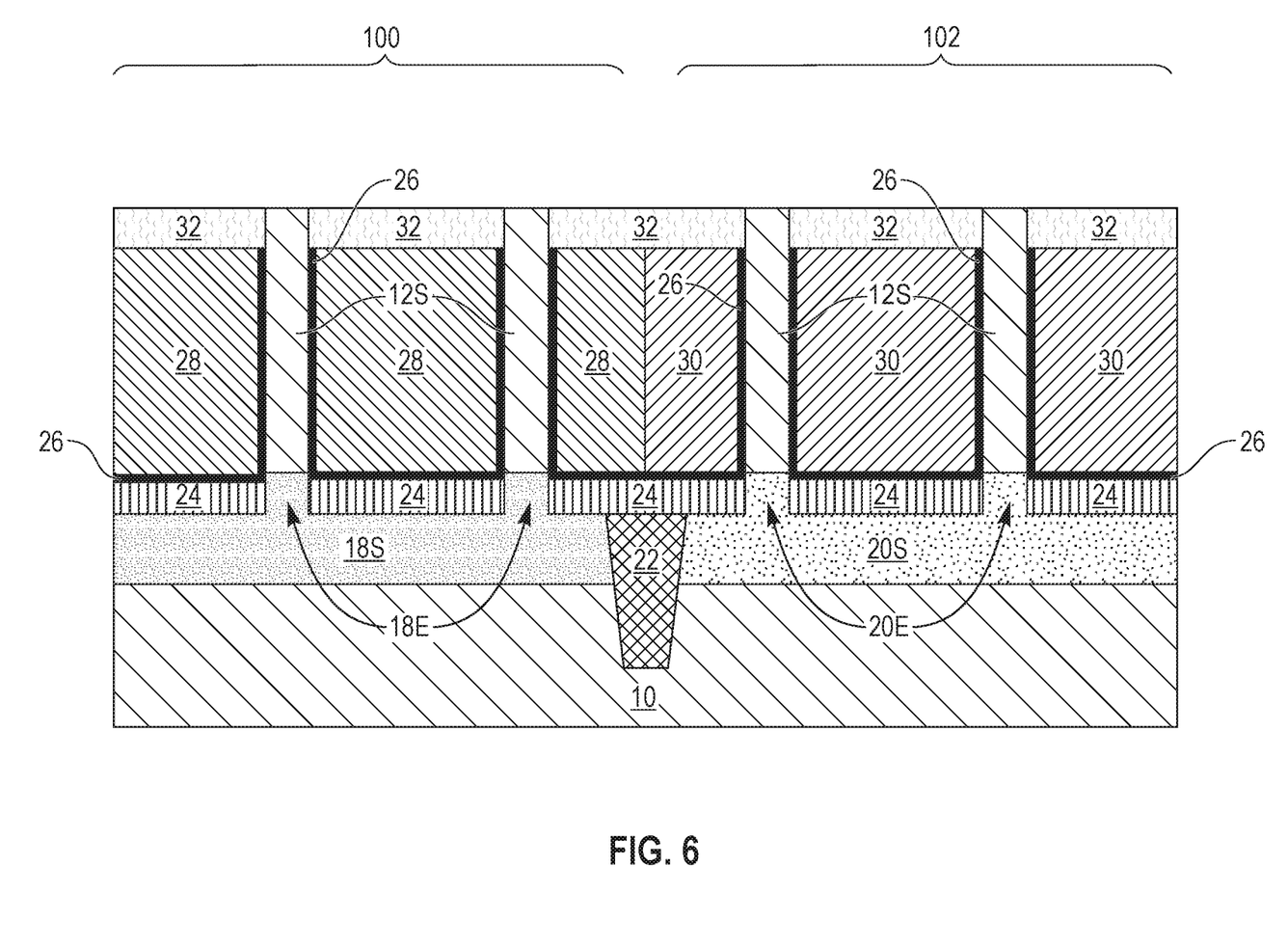
FIG. 6 is a cross sectional view of the exemplary semiconductor structure of FIG. 5 after removing the dielectric hard mask cap from each semiconductor material structure, and forming a top spacer layer.

Referring now to FIG. 6, there is illustrated the exemplary semiconductor structure of FIG. 5 after removing the dielectric hard mask cap 14 from each semiconductor material structure 12, and forming a top spacer layer 32. The removal of the dielectric hard mask cap 14 is typically performed after the forming the top spacer layer 32.

The top spacer layer 32 is formed upon the nFET gate structure (26, 28) and upon the pFET gate structure (26, 30). The top spacer layer 32 can include one of the dielectric materials mentioned above for the bottom spacer layer 24; the top spacer layer 32 is composed of a different dielectric material than the dielectric hard mask cap 14. The top spacer layer 32 can be formed utilizing one of the deposition processes mentioned above in forming the bottom spacer layer 24. The top spacer layer 32 can have a thickness within the thickness range mentioned above for the bottom spacer layer 24. The top spacer layer 32 has a sidewall that directly contacts the upper portion of the physically exposed sidewall of each of the semiconductor material structures 12. In some embodiments, the top spacer layer 32 has a topmost surface that is coplanar with a topmost surface of each of the semiconductor material structures 12.

The removal of the dielectric hard mask cap 14 can include any material removal process that is selective in removing each dielectric hard mask cap 14 from the semiconductor material structures 12. In one example, the dielectric hard mask cap 14 can be removed utilizing a selective wet etching process such as, for example, a diluted HF+HCl solution or hot phosphorus. The removal of the dielectric hard mask cap 14 physically exposes a topmost surface of the underlying semiconductor material structure 12.

Figure 7:
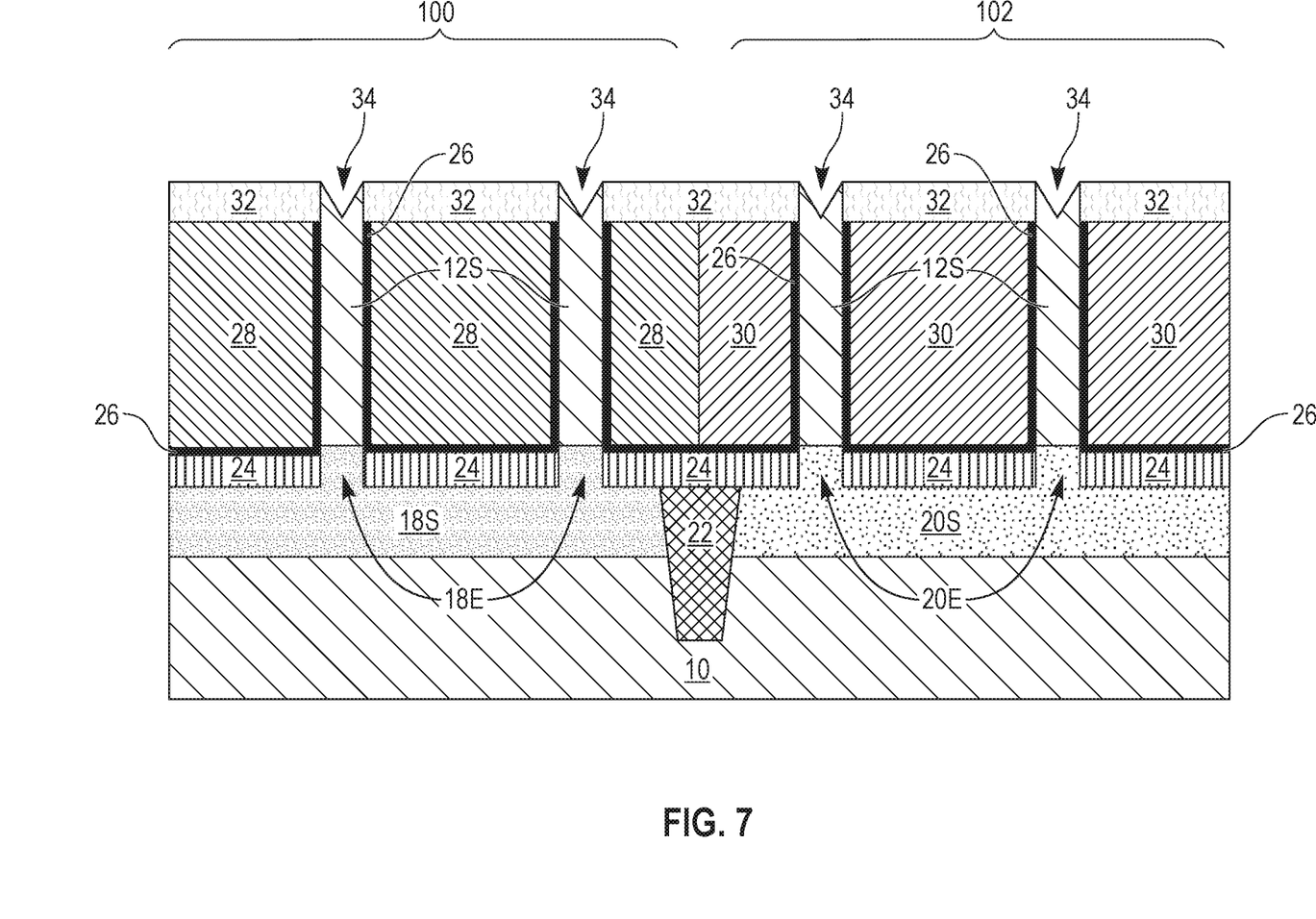
FIG. 7 is a cross sectional view of the exemplary semiconductor structure of FIG. 6 after forming a V-shaped groove in a topmost surface of each of the semiconductor material structures to provide a plurality of vertical semiconductor channel material structures having the V-shaped groove located in the topmost surface thereof.

Referring now to FIG. 7, there is illustrated the exemplary semiconductor structure of FIG. 6 after forming a V-shaped groove 34 in a topmost surface of each of the semiconductor material structures 12 to provide a plurality of vertical semiconductor channel material structures 12S having the V-shaped groove 34 located in the topmost surface thereof. The V-shaped groove 34 has a shape of an inverted triangle in which the tip of the inverted triangle extends downward into each vertical semiconductor channel material structure 12. The tip of the inverted triangle that defines the V-shaped groove 34 can extend to a level that is equal to, or beneath, a topmost surface of the nFET gate structure (26, 28) and/or the pFET gate structure (26, 30). The V-shaped groove 34 forms a top junction region of the device.

The forming of the V-shaped groove 34 in a topmost surface of each of the semiconductor material structures 12 includes a crystallographic etching process. The crystallographic etching process can include contacting the topmost surface of the semiconductor material structures 12 with a chemical etchant. In one example, and when the semiconductor material structures 12 are composed of silicon, the chemical etchant can be potassium hydroxide (KOH) or tetramethyl ammonium hydroxide (TMAH). In such an embodiment, the V-shaped groove 34 of each vertical semiconductor channel material 12S can have physically exposed (111) surfaces.

Figure 8:
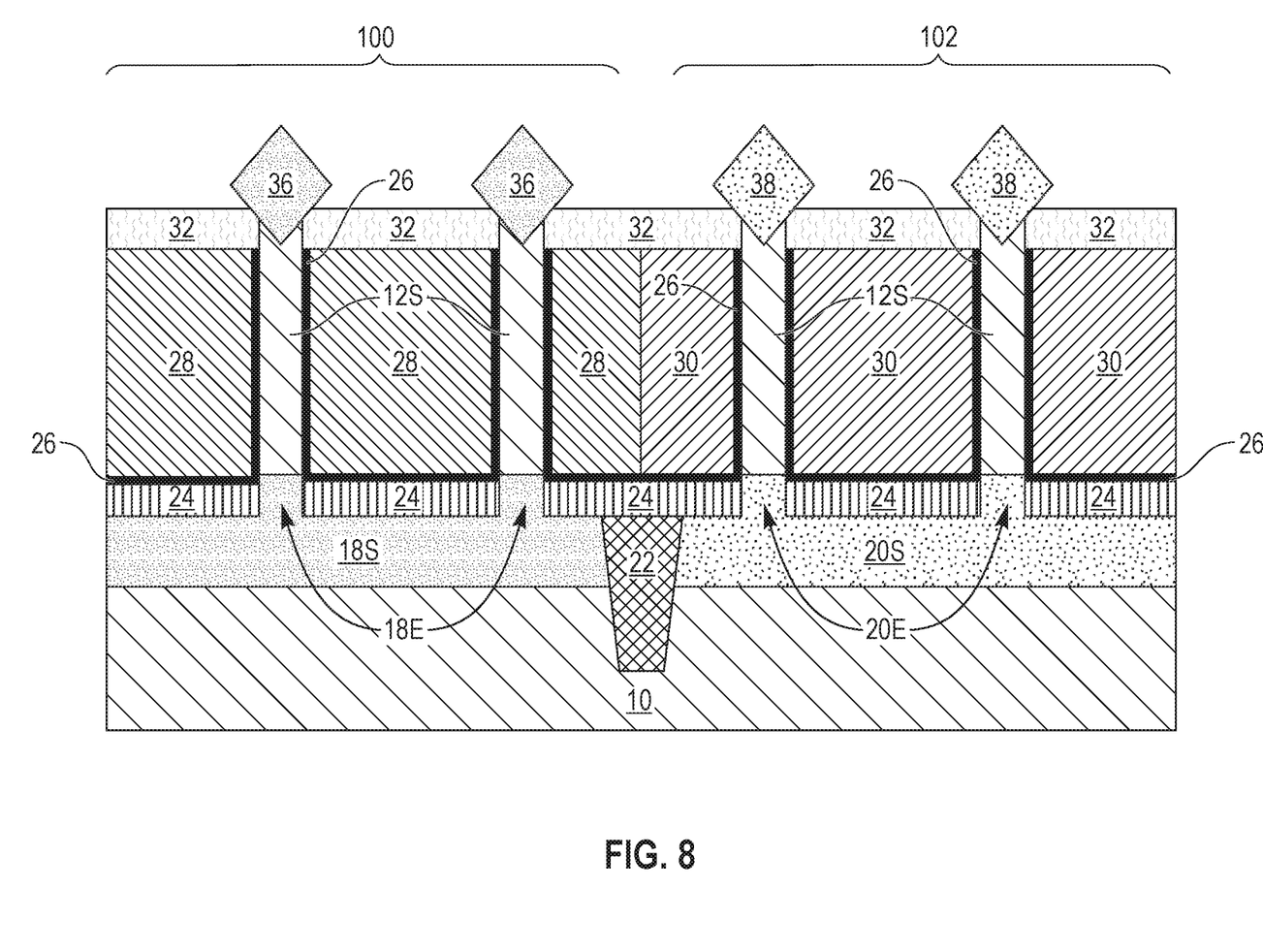
FIG. 8 is a cross sectional view of the exemplary semiconductor structure of FIG. 7 after forming a top nFET S/D structure in each V-shaped groove present in the topmost surface of each of the vertical semiconductor channel material structures present in the nFET device region, and a top pFET S/D structure in each V-shaped groove present in the topmost surface of each of the vertical semiconductor channel material structures present in the pFET device region.

Referring now to FIG. 8, there is illustrated the exemplary semiconductor structure of FIG. 7 after forming a top nFET S/D structure 36 in each V-shaped groove 34 present in the topmost surface of each of the vertical semiconductor channel material structures 12S present in the nFET device region 100, and a top pFET S/D structure 38 in each V-shaped groove 34 present in the topmost surface of each of the vertical semiconductor channel material structures 12S present in the pFET device region 102.

The top nFET S/D structure 36 and the top pFET S/D structure 38 can be formed utilizing an epitaxial growth (or deposition) process, as defined above, and in any order. The dopants within the top S/D structure (36, 38) are typically introduced during the epitaxial growth process. No drive-in anneal is performed. Since no drive-in anneal is used, the gate structures are not negatively impacted. In one embodiment, the top nFET S/D structure 36 can be formed prior to the top pFET S/D structure 38. In such an embodiment, a block mask is formed in the pFET device region 102 and then the top nFET S/D structure 36 is formed by epitaxial growth. Following the epitaxial growth of the top nFET S/D structure 36, the block mask is removed from the pFET device region 102, another block mask is formed in the nFET device region 100 that now includes the top nFET S/D structure 36, and thereafter the top pFET S/D structure 38 is formed by epitaxial growth. Following epitaxial growth of the top pFET S/D structure 38, the another block mask is removed from the nFET device region 100. In embodiments, in which the top pFET S/D structure 38 is formed prior to the top nFET S/D structure 36, the order of the above mentioned processing steps is reversed.

The top nFET S/D structure 36 includes a semiconductor material (as defined above) and an n-type dopant (as also defined above). The semiconductor material that provides the top nFET S/D structure 36 can be compositionally the same as, or compositionally different from, the semiconductor material that provides the bottom nFET S/D structure 18S and/or the vertical semiconductor channel material structure 12S. The concentration of n-type dopant within the semiconductor material that provides the top nFET S/D structure 36 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived. The top pFET S/D structure 38 can have a faceted surface. In one example, the top pFET S/D structure 38 can be diamond shaped.

The top pFET S/D structure 38 includes a semiconductor material (as defined above) and a p-type dopant (as also defined above). The semiconductor material that provides the top pFET S/D structure 38 can be compositionally the same as, or compositionally different from, the semiconductor material that provides the bottom pFET S/D structure 20S and/or the vertical semiconductor channel material structure 12S. The concentration of p-type dopant within the semiconductor material that provides the top pFET S/D structure 38 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived. The top pFET S/D structure 38 can have a faceted surface. In one example, the top pFET S/D structure 38 can be diamond shaped.

FIG. 8 (and FIG. 9 to follow) illustrates an exemplary structure of the present application that includes an n-type vertical transport field effect transistor (VTFET) and a laterally adjacent p-type VTFET. The n-type VTFET includes at least one vertical semiconductor channel material structure 12S having a V-shaped groove 34 located in a topmost surface thereof and present in an nFET device region 100, a bottom nFET source/drain structure 18S is located beneath the at least one vertical semiconductor channel material structure 12S present in the nFET device region 100, a top nFET source/drain structure 36 contacting the V-shaped groove 34 of the at least one vertical semiconductor channel material structure 12S present in the nFET device region 100, and an nFET gate structure (26, 28) is located laterally adjacent to a sidewall of the at least one vertical semiconductor channel material structure 12S present in the nFET device region 100.

Figure 9:
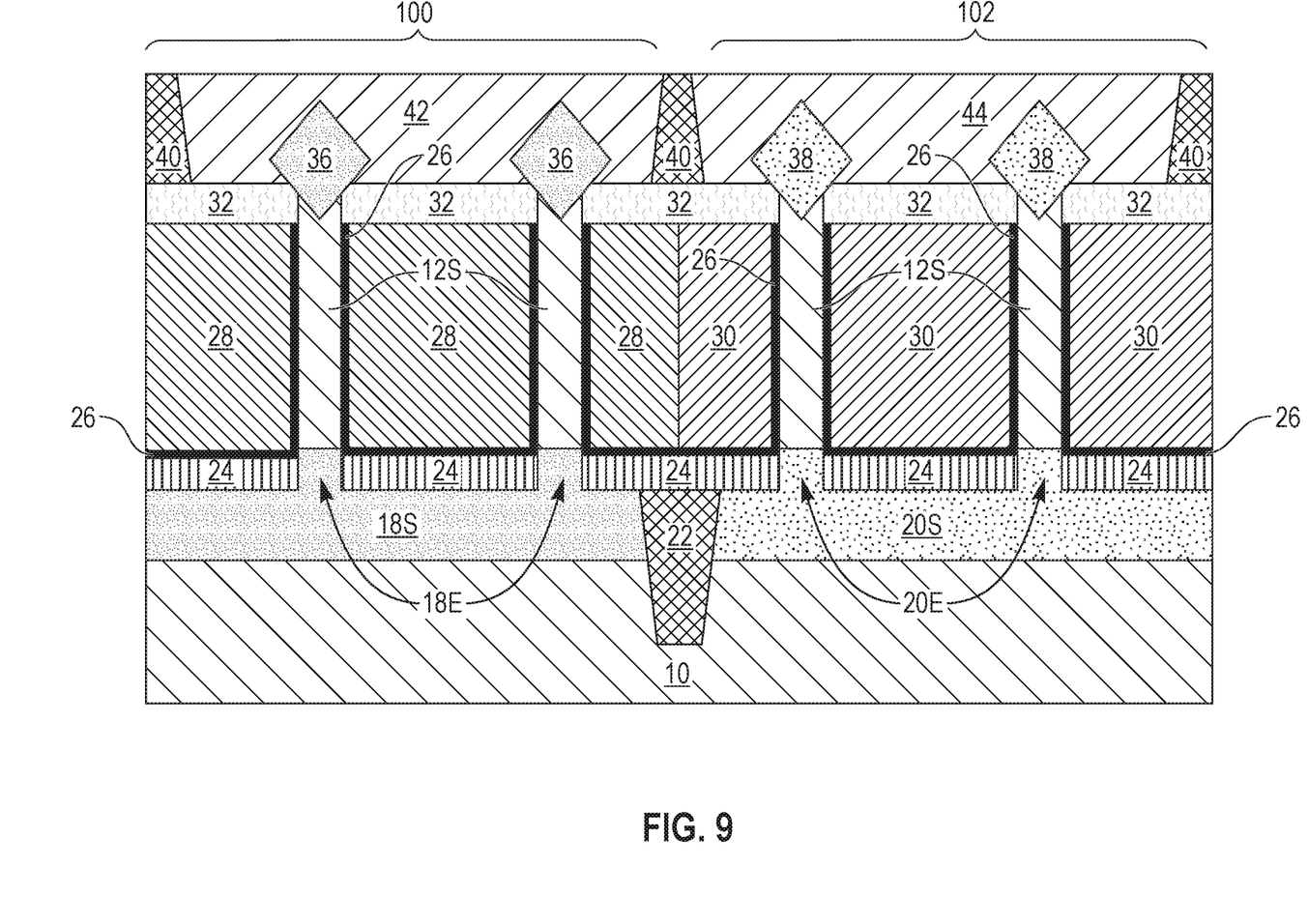
FIG. 9 is cross sectional view of the exemplary semiconductor structure of FIG. 8 after forming an interlayer dielectric (ILD) material layer having an nFET contact structure and a pFET contact structure embedded therein.

The p-type VTFET includes at least one vertical semiconductor channel material structure 12S having a V-shaped groove 34 located in a topmost surface and present in a pFET device region 102, a bottom pFET source/drain structure 20S is located beneath the at least one vertical semiconductor channel material structure 12S present in the pFET device region 102, a top pFET source/drain structure 38 contacts the V-shaped groove 34 of the at least one vertical semiconductor channel material structure 12S present in the pFET device region 102, and a pFET gate structure (26, 30) is located laterally adjacent to a sidewall of the at least one vertical semiconductor channel material structure 12S present in the pFET device region 102.

Referring now to FIG. 9, there is illustrated the exemplary semiconductor structure of FIG. 8 after forming an interlayer dielectric (ILD) material layer 40 having an nFET contact structure 42 and a pFET contact structure 44 embedded therein.

The ILD material layer 40 is composed of a dielectric material such as, for example, silicon dioxide, undoped silicate glass (USG), fluorosilicate glass (FSG), borophosphosilicate glass (BPSG), a spin-on low k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as the ILD material layer 40; the term "low-k" denotes a dielectric material having a dielectric constant of less than 4.0. In one embodiment, ILD material layer 40 can be formed utilizing a deposition process including, for example, chemical vapor deposition (CVD), plasma enhanced chemical vapor deposition (PECVD), evaporation or spin-on coating. Following deposition of the ILD material layer 40, a planarization process such as, for example, chemical mechanical polishing (CMP), can employed.

Contact openings are then formed into ILD material layer 40. The contact openings can be formed by lithography and etching. A contact metal such as, for example, copper, aluminum, tungsten, cobalt, or alloys thereof is then formed into each contact opening utilizing a deposition process. A planarization process can follow the deposition process. The contact metal or metal alloy within each contact opening is referred to herein as a contact structure 42, 44. Contact structure 42, (i.e., an nFET contact structure) contacts the top nFET S/D structures 36, while contact structure 44 (i.e., a pFET contact structure) contacts the top pFET S/D structures 38. As shown in FIG. 9, the contact structures 42, 44 have a topmost surface that is coplanar with a topmost surface of the ILD material layer 40.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   at least one vertical semiconductor channel material structure having a V-shaped groove located in a topmost surface thereof;
   a bottom source/drain structure located beneath the at least one vertical semiconductor channel material structure;
   a bottom spacer layer located on the bottom source/drain structure and contacting a sidewall of an extension region of the bottom source/drain structure;
   a top source/drain structure contacting the V-shaped groove of the at least one vertical semiconductor channel material structure; and
   a gate structure located laterally adjacent to a sidewall of the at least one vertical semiconductor channel material structure, wherein no diffused top source/drain dopants are present in the at least one vertical semiconductor channel material structure.

2. The semiconductor structure of claim 1, wherein the gate structure is an nFET gate structure comprising a high-k gate dielectric material and an n-type work function metal.

3. The semiconductor structure of claim 1, wherein the gate structure is a pFET gate structure comprising a high-k gate dielectric material and a p-type work function metal.

4. The semiconductor structure of claim 1, further comprising a top spacer layer located above the gate structure and contacting a sidewall of an upper portion of the at least one vertical semiconductor channel material structure.

5. The semiconductor structure of claim 1, further comprising an interlayer dielectric material layer located laterally adjacent to, and embedding the top source/drain structure.

6. The semiconductor structure of claim 1, further comprising a contact structure embedded in the interlayer dielectric material layer and contacting a surface of the top source/drain structure.

7. A semiconductor structure comprising:
an n-type vertical transport field effect transistor (VTFET) and a laterally adjacent p-type VTFET, wherein
the n-type VTFET comprises at least one vertical semiconductor channel material structure having a V-shaped groove located in a topmost surface thereof and present in an nFET device region; a bottom nFET source/drain structure located beneath the at least one vertical semiconductor channel material structure present in the nFET device region; a top nFET source/drain structure contacting the V-shaped groove of the at least one vertical semiconductor channel material structure present in the nFET device region; and an nFET gate structure located laterally adjacent to a sidewall of the at least one vertical semiconductor channel material structure present in the nFET device region; and
the p-type VTFET comprises at least one vertical semiconductor channel material structure having a V-shaped groove located in a topmost surface and present in a pFET device region; a bottom pFET source/drain structure located beneath the at least one vertical semiconductor channel material structure present in the pFET device region; a top pFET source/drain structure contacting the V-shaped groove of the at least one vertical semiconductor channel material structure present in the pFET device region; and a pFET gate structure located laterally adjacent to a sidewall of the at least one vertical semiconductor channel material structure present in the pFET device region.

8. The semiconductor structure of claim 7, wherein the nFET gate structure comprising a high-k gate dielectric material and an n-type work function metal, and the pFET gate structure comprising another high-k gate dielectric material and a p-type work function metal.

9. The semiconductor structure of claim 7, further comprising a bottom spacer layer located on both the bottom nFET source/drain structure and the bottom pFET source/drain structure, wherein the bottom spacer contacts the sidewall of a lower portion of the at least one vertical semiconductor channel material structure present in both the nFET device region and the pFET device region.

10. The semiconductor structure of claim 9, further comprising a top spacer layer located above both the nFET gate structure and the pFET gate structure, wherein the top spacer contacts the sidewall of an upper portion of the at least one vertical semiconductor channel material structure present in both the nFET device region and the pFET device region.

11. The semiconductor structure of claim 7, further comprising an interlayer dielectric material layer located laterally adjacent to, and embedding both the top nFET source/drain structure and the top pFET source/drain structure.

12. The semiconductor structure of claim 11, further comprising an nFET contact structure embedded in the interlayer dielectric material layer and contacting a surface of the top nFET source/drain structure, and a pFET contact structure embedded in the interlayer dielectric material layer and contacting a surface of the top pFET source/drain structure.

13. A method of forming a semiconductor structure, the method comprising:
forming at least one semiconductor material structure extending upward from a surface of a semiconductor substrate;
forming a bottom source/drain structure beneath the at least one semiconductor material structure;
forming a gate structure contacting a sidewall of the at least one semiconductor material structure;
forming a V-shaped groove in a topmost surface of the at least one semiconductor material structure to provide at least one vertical semiconductor channel material structure having the V-shaped groove located in the topmost surface thereof; and
forming a top source/drain structure in the V-shaped groove present in the topmost surface of the at least one vertical semiconductor channel material structure, wherein the forming of the top source/drain structure does not include a drive-in anneal process, and wherein the forming of the bottom source/drain structure comprises:
forming a sacrificial liner on the sidewall of the least one semiconductor material structure;
recessing physically exposed portions of the semiconductor structure;
epitaxially growing a doped semiconductor material on the recessed portions of the semiconductor structure; and
performing a drive-in anneal to provide an extension region of the bottom source/drain structure in the physically exposed portions of the semiconductor structure.

14. The method of claim 13, further comprising forming an interlayer dielectric material layer laterally adjacent to, and embedding the top source/drain structure, wherein a contact structure is present in the interlayer dielectric material layer that contacts a surface of the top source/drain structure.

15. The method of claim 13, wherein the forming of the V-shaped groove comprises a crystallographic etching process.

16. The method of claim 13, wherein the least one semiconductor material structure is composed of silicon, and the V-shaped groove has physically exposed (111) surfaces.

17. The method of claim 13, further comprising forming a bottom spacer layer on the bottom source/drain structure and contacting the sidewall of a lower portion of the at least one semiconductor material structure, wherein the bottom spacer layer is formed prior to forming the gate structure.

18. The method of claim 17, further comprising forming a top spacer layer above the gate structure and contacting the sidewall of an upper portion of the least one semiconductor material structure.

* * * * *